July 29, 1969 A. GEE 3,458,777

PIN DIODE WITH A NON-UNIFORM INTRINSIC REGION WIDTH

Filed Sept. 21, 1966

INVENTOR.
Allen Gee,
BY
ATTORNEY.

United States Patent Office 3,458,777

Patented July 29, 1969

3,458,777

PIN DIODE WITH A NON-UNIFORM INTRINSIC REGION WIDTH

Allen Gee, Newport Beach, Calif., assignor to Hughes Aircraft Company, Culver City, Calif., a corporation of Delaware Filed Sept. 21, 1966, Ser. No. 581,025
Int. Cl. H01l 5/00
U.S. Cl. 317—234 2 Claims

ABSTRACT OF THE DISCLOSURE

A PIN diode wherein the width of the intrinsic region is not constant, there being a shallow recess in one surface of the diode having a minimum area of at least one-fourth of that of the total surface area, the width of the intrinsic region at the internal portion being at least 80% of the width of the peripheral portion thereof.

Figure 1:
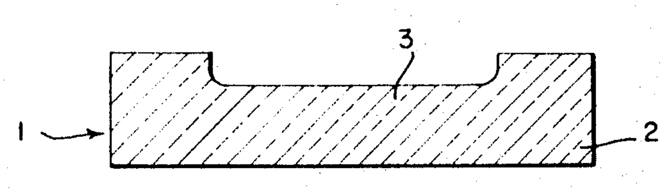

This invention relates to semiconductor unijunction devices. More particularly, the invention relates to such a semiconductor device of the type referred to as a PIN switching diode having a stated capacitance under reverse bias as well as a low loss or equivalent resistance at microwave frequencies under either forward or reverse bias conditions. The device of the invention is useful as a switch in phase radar antenna arrays.

Devices of the type to which the present invention appertains are known as PIN switches which designation derives from the device structure in which an intrinsic or I region is disposed between a positive charge carrier or P region and a negative charge carrier or N region in a semiconductor body. It will be understood, therefore, that P and N refer to regions of a semiconductor body in which the conduction of current is accomplished by positive majority charge carriers ("holes") or by negative majority charge carriers (electrons), the type of conductivity being determined by the kind and degree of incorporation of conductivity-type-determining impurities in the semiconductor body or the different regions thereof. It will thus be further understood that I refers to a region of intrinsic semiconductor material in which there is either an absence of conductivity-type-determining impurities of either type or impurities which are present balance out or compensate each other. In PIN devices of the kind to which the present invention relates, the P-type and N-type impurities are incorporated into a body of intrinsic semiconductor by diffusion of the respective impurities from opposite surfaces thereof resulting in a layered or sandwiched structure of P-I-N configuration. The devices of the prior art are characterized by having the N-type and the P-type diffusion fronts formed parallel to each other in the semiconductor body so that the base or I region is of constant width between the P and N regions.

One of the objects of the present invention is to provide an improved semiconductor diode device of the PIN type.

Another object of the invention is to provide an improved semiconductor switching device of the PIN type having a lower forward resistance at microwave frequencies than heretofore attainable.

Still another object of the invention is to provide an improved semiconductor switching device of the PIN type which exhibits the breakdown voltage characteristic of a device having a wide base (i.e., thickness of the I region) with the low forward resistance characteristic of a narrow base device especially at microwave frequencies.

Yet another object of the invention is to provide an improved semiconductor switching device which is capable of handling substantially equal power in either the forward or reverse bias modes at microwave frequencies.

These and other objects and advantages of the invention are achieved in part by providing a PIN diode device in which the P-type and the N-type diffusion fronts are not parallel whereby the width of the base or I region between the P-type and N-type regions is not constant. This structure is realized by providing a shallow dimple or recess in a portion of an intrinsic semiconductor body and thereafter diffusing the P-type and the N-type impurities into the body from opposite surfaces thereof. To further achieve the advantages of the invention, the minimum area of the dimple is one-fourth that of the area of the semiconductor body surface and the intrinsic base width at the narrow portion of the base is at least 80% of the wide portion.

Figure 2:
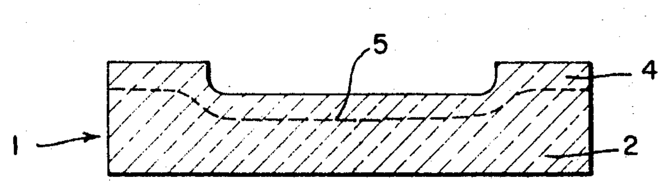
Figure 3:
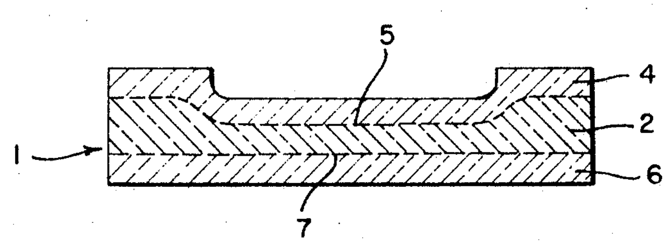
Figure 4:
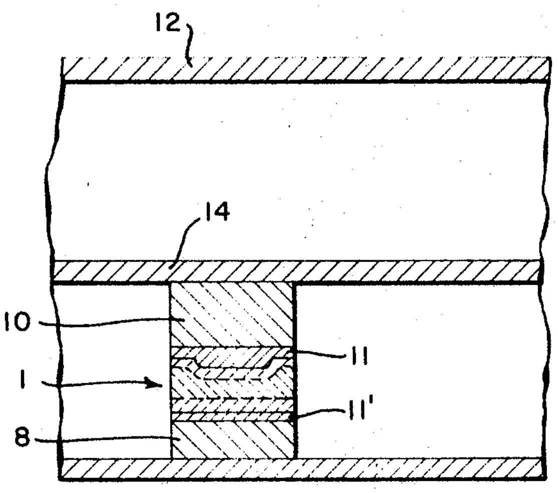

The invention will be described in greater detail by reference to the drawings in which FIGURES 1 through 3 are cross-sectional elevational views of a semiconductor device according to the invention in successive stages of fabrication, and FIGURE 4 is a similar view of a completed device according to the invention connected into a coaxial-type microwave transmission line.

While the invention will be described with reference to a single diode device, it will be understood in practice that a plurality of devices are fabricated simultaneously in a wafer of semiconductor material which is subsequently diced up to yield discrete devices. Referring now to FIGURE 1, a body 2 of semiconductor material such as silicon, for example, is shown. The silicon body 2 may be circular and is provided with a circular recess or valley region 3 on one surface thereof. The silicon body 2 at this stage of fabrication is of intrinsic conductivity having an exemplary resistivity of about 1000 ohm-cm. A typical device body may be about 6.5 mils thick and about 100 mils in diameter and the recess 3, hereinafter referred to as a "dimple," may be about 0.5 mil deep and 60 mils in diameter. The dimple region 3 may be formed by masking the surface of the silicon body leaving the dimple exposed and then removing the exposed portion by etching as with hydrofluoric acid-nitric acid mixtures, for example. In this example, the area of the dimple 3 is about 36% that of the surface of the semiconductor body.

Referring now to FIGURE 2, the device body 2 is next subjected to a diffusion treatment so as to incorporate therein from the surface containing the dimple 3 a P-type conductivity-type-determining impurity such as boron, for example. This treatment is well known in the art and need not be described in great detail herein. Suffice it to say that the silicon body 2 may be heated to a temperature of about 1300° C. in the presence of a source of boron vapors to which the dimpled surface is exposed. The treatment is carried out for a period of time to achieve a final penetration depth of boron atoms into the silicon body 2 of about 2 mils. This processing results in the formation of a heavily doped, deep diffused region 4 which is practically degenerate at the surface. By "degenerate" it is meant that the conductivity of the silicon body at its surface is substantially that of a good metallic conductor. It will be understood that between the P-type region 4 and the intrinsic region 2, a barrier or junction 5 is formed which is substantially parallel to or follows the contour of the surface of the device body. It is desirable to preserve a high carrier lifetime characteristic by cooling the silicon body to room temperature from the diffusion in both this diffusion process and the subsequent one described hereinafter.

Referring now to FIGURE 3, the device body 2 is next subjected to a further diffusion treatment so as to incorporate therein from the surface thereof opposite to the dimpled surface an N-type conductivity-type-determining impurity such as phosphorus, for example. This treatment is substantially the same as described for the boron diffusion and is carried out for a period of time sufficient to achieve a penetration of phosphorus atoms into the silicon body of about 2 mils. This processing similarly results in the formation of a heavily doped, deep diffusion region 6 which is also practically degenerate at the surface. Between the intrinsic region 2 and the N-type region 6 a barrier or junction 7 is formed which is substantially parallel to the surface into which the N-type impurity was diffused. This junction 7 or diffusion front is thus essentially linear, and not parallel to the diffusion front 5. Hence, the intrinsic region 2 lying between the two diffused regions 4 and 6 is not of contant width. More particularly, the widest portions of the intrinsic region 2 are its peripheral portions which underlie the annular, unetched peripheral portions of the P-type region 4. In the example given, the width of the widest portion of the intrinsic base region 2 may be about 2.5 mils and the width of the narrow portion may be about 2.0 mils.

Fabrication of the device is completed with the attachment as by bonding of electrical contacts thereto which is illustrated in FIGURE 4. Satisfactory contacts may comprise silver-plated molydenum studs 8 and 10 which are bonded by solder 11, 11' to opposite surfaces of the rectifier device. The dimple region 3 on the one surface of the device body 1 is shown as being filled with the solder 11 effecting this bond. It may also be desirable to cover the sides of the device with a varnish or silicone resin (not shown) to further protect the device against deleterious effects of the ambient surrounding the device.

As shown in FIGURE 4, the device of the invention may be connected into a microwave coaxial transmission line comprising an outer cylindrical section 12 and an inner conductor 14 which is coaxially disposed within the outer section 12 as is well known. The device is coupled between the inner conductor 14 and the outer conductor 12 and may have its stud contacts 8 and 10 bonded as by soldering thereto.

One of the surprising features of the device of the invention is that the forward resistance of the device at microwave frequencies is significantly lower than that of prior art devices having a uniform base width equal to that of the narrow portion of the base in the instant device. The cut-off frequency for the device of the invention is 20 to 50% higher than that of comparable prior art devices.

What is claimed is:

1. A semiconductor device comprising a body of semiconductor material in which a region of high resistivity is disposed between diffused regions of low resistivity of opposite conductivity and forming therewith; said diffused regions having surface portions disposed, respectively, on opposite conductivity and forming junctions therewith; said diffused regions having surface portions disposed, respectively, on opposite sides of said body; one of said diffused regions having a recess in a surface thereof, the area of said recess being at least one-fourth the area of said surface; said junctions associated with said regions being non-parallel with respect to each other whereby the width of said region of high resistivity at internal portions thereof is at least 80% of the width at peripheral portions thereof; and electrical contacts affixed to said surface portions of said diffused regions.

2. A semiconductor device comprising a body of silicon in which an intrinsic region is disposed between diffused, low resistivity P-type and N-type regions; said P-type and N-type regions forming respective junctions with said intrinsic region and having surface portions disposed, respectively, on opposite sides of said silicon body; said P-type region having a recessed surface portion, the area of said recessed portion being at least one-fourth the area of the surface of said P-type region; said junctions being non-parallel with respect to each other whereby the width of said intrinsic region at internal portions thereof is at least 80% of the width at peripheral portions thereof; and electrical contacts affixed to said surface portions of said P-type and said N-type regions.

References Cited

UNITED STATES PATENTS

| | | | |
|---|---|---|---|
| 2,831,787 | 4/1958 | Emeis | 148—1.5 |
| 3,008,089 | 11/1961 | Uhlir | 330—5 |
| 3,370,209 | 2/1968 | Davis et al. | 317—235 |

JOHN W. HUCKERT, Primary Examiner

R. SANDLER, Assistant Examiner

U.S. Cl. X.R.

148—187

PO-1050
(5/69)

UNITED STATES PATENT OFFICE
CERTIFICATE OF CORRECTION

Patent No. 3,458,777 Dated July 29, 1969

Inventor(s) Allen Gee

It is certified that error appears in the above-identified patent and that said Letters Patent are hereby corrected as shown below:

Column 4, line 5, Cancel entirely this line which reads as follows:
"opposite conductivity and forming therewith; said diffused".

Column 4, line 6, Cancel entirely this line which reads as follows:
"regions having surface portions disposed, respectively, on".

Signed and sealed this 23rd day of March 1971.

(SEAL)
Attest:

EDWARD M. FLETCHER, JR.
Attesting Officer

WILLIAM E. SCHUYLER, JR.
Commissioner of Patents